United States Patent [19]
Dennison et al.

[11] Patent Number: 4,754,436
[45] Date of Patent: Jun. 28, 1988

[54] SENSE AMPLIFIER FOR A READ ONLY MEMORY CELL ARRAY

[75] Inventors: Stanley M. Dennison, Jonesborough, Tenn.; Jeffrey D. Bellay, Houston, Tex.

[73] Assignee: Texas Instruments Incorporated, Dallas, Tex.

[21] Appl. No.: 894,988

[22] Filed: Aug. 8, 1986

[51] Int. Cl.[4] ............................................. G11C 13/00
[52] U.S. Cl. .................................. 365/230; 307/530; 365/203
[58] Field of Search ................ 307/530; 365/189, 230, 365/241, 203

[56] References Cited

U.S. PATENT DOCUMENTS 4,627,032 12/1986 Kocwicz et al. .................... 365/203

Primary Examiner—Terrell W. Fears
Attorney, Agent, or Firm—Richard A. Bachand; Theodore D. Lindgren

[57] ABSTRACT

A sense amplifier for a read only memory cell array which includes a dynamic NOR circuit having high impedance inputs coupled to bitlines of the array. An inverter circuit has an input coupled to an output of the dynamic NOR circuit. An output buffer circuit has an input coupled to an output of the inverter circuit.

10 Claims, 3 Drawing Sheets

SENSE AMPLIFIER FOR A READ ONLY MEMORY CELL ARRAY

BACKGROUND OF THE INVENTION

The present invention relates to a sense amplifier for a read only memory cell array.

The proliferation of the number of circuit components on integrated circuits in VLSI technology has put pressure on designers to simplify circuits as much as possible. In addition, the movement towards smaller and smaller design layout rules has resulted in faster and faster circuits. Accordingly, there is a requirement for a sense amplifier design which has a relatively simple layout and which is fast enough to match the speed of present VLSI technology.

Therefore, it is an object of the present invention to provide an improved sense amplifier for a read only memory cell array.

SUMMARY OF THE INVENTION

According to the invention there is provided a sense amplifier for a read only memory cell array of a type having a plurality of bit lines and a bit line precharging circuit which includes a primary logic circuit having high impedance inputs coupled to respective bit lines of the array. An output buffer circuit has an input coupled to an output of the primary logic circuit. Use of a high input impedance device coupled to each bit line ensures that the sense amplifier will have a fast response time.

Preferably the primary logic circuit is a dynamic NOR circuit which has a plurality of series connected P-channel transistors whose gates are coupled to corresponding bit lines. A high voltage NOR switch means is coupled between a high voltage source and a high voltage end of the P-channel transistors and a NOR ground switch means is coupled between ground and a ground end of the series connected transistors. The high voltage switch means applies high voltage to the one end in response to a complement of an NOE1 signal and the ground switch means applies ground to the other end in response to the NOE1 signal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
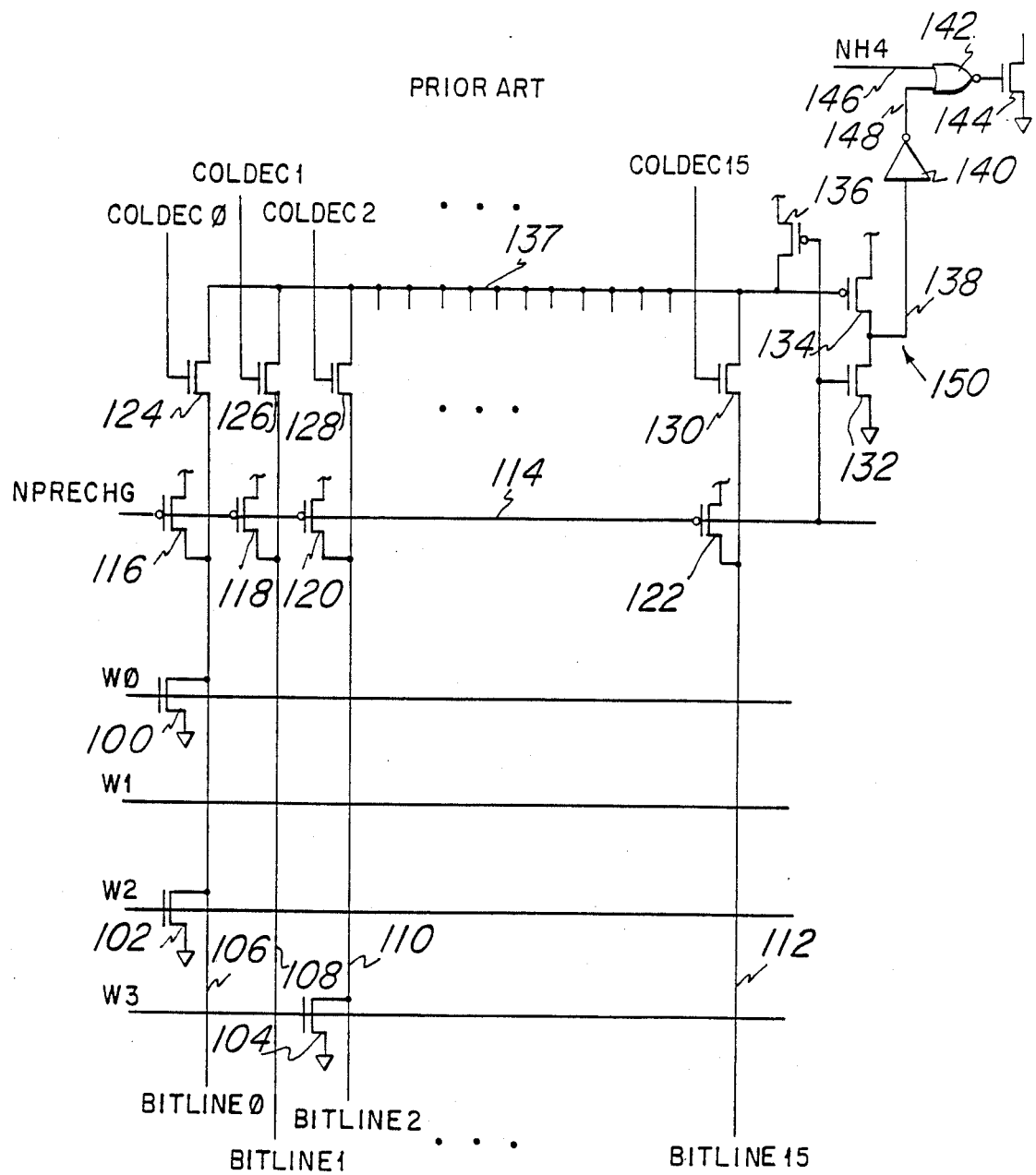
FIG. 1 is a circuit diagram of a conventional sense amplifier design.

Referring to FIG. 1, there is shown a conventional scheme of decoding and sensing which includes a plurality of rows W0, W1, W2, and W3 intersecting a plurality of bitlines 106, 108, 110, ..., 112. At selected intersections of the row and bitlines there are corresponding array transistors 100, 102, and 104, etc. whose gates are connected to corresponding row lines. The sources of the array transistors are coupled to ground. The presence or absence of a transistor at an intersection represents programmations of the array. Sixteen precharge P-channel transistors 116, 118, ..., 122 and transistor 136 have their gates coupled to NPRECHG line and their sources coupled to bitlines 106, 108, ..., 112 and line 137, respectively. The latter turn on when NPRECHG goes low and apply a high voltage $V_{cc}$ to corresponding bit lines 106, 108, 110, ..., 112 and line 137 charging up the latter lines.

Each of the word lines W0, W1, W2, and W3 are coupled to a decoder output (not shown) which applies a word line voltage to a selected one of the aforesaid word lines. Any array transistor coupled to the selected word line is turned on by the selection voltage on that word line and drives the bit line to which it is coupled towards ground. Upon coldecN (N=0, 1, 2, ..., 15) for that bit line going high the corresponding bit line is coupled through the selected one of column transistors 124, 126, ..., 130 to line 137. Line 137 which is coupled to the gate of P-channel transistor 134 is also coupled to the drains of all 16 of bit line select transistors 124, 126, ..., 130 and to the source of P-channel transistor 136. When a bit line is coupled through a selected one of transistors 124, 126, ... 130 it drives line 137 low until transistor 134 of sense amplifier 150 turns on coupling Vcc to line 138. A high signal on line 138 results in a low output from inverter 140 into one of the two inputs to NOR circuit 142. The other input NH4 on line 146 goes low causing a high output from circuit 142 and a turning on of transistor 144. During precharge transistor 132 is on thus ensuring that line 138 is held at or near ground.

One problem with the circuit of FIG. 1 occurs because of the large amount of capacitance on line 137 due to all of the drains of transistors 124, 126, ... and 130 being coupled to this line. This capacitance exists between a selected bit line and the sense amplifier 150 represented by transistors 134, 132, inverter 140, nor gate 142 and transistor 144. Transistors 124, 126, ..., 130 each must be about 5–10 times the size of the array transistors 100, 102, 104, ..., etc. in order to minimize the resistance component they introduce when coupled to the sense amplifier 150. The foregoing combination of resistance and capacitance operates to slow down the response of the sense amplifier 150.

Figure 2:
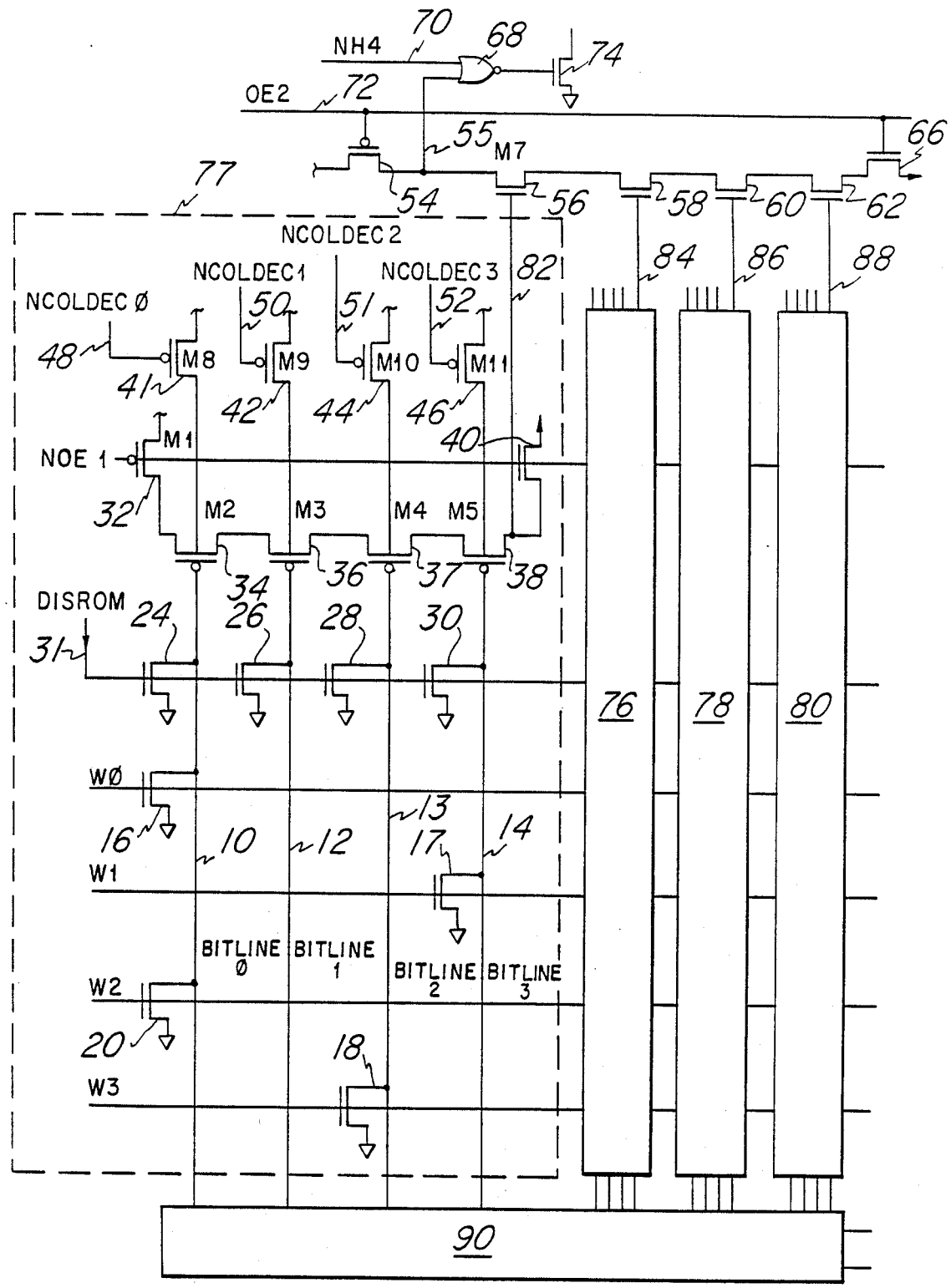
FIG. 2 is a circuit diagram of the sense amplifier shown in conjunction with a ROM array.

With reference to FIG. 2, there is shown a circuit diagram of a sense amplifier in combination with a ROM array according to a preferred embodiment of the present invention. The sense amplifier consists of transistors 32, 34, 36, 37, 38, and 56. Each of transistors 34, 36, 37 and 38 is a P-channel device having a gate that is connected to respective columns 10, 12, 13, and 14, respectively, of the ROM array and whose source to drain paths are all connected in series. Also having source to drain paths in series with those of transistors 34, 36, 37, and 38 is P-channel transistor 32 and N-channel transistor 40. The source of transistor 32 is coupled to high voltage source $V_{cc}$ while that of transistor 40 is connected to ground potential $V_{ss}$. The drain of transistor 40 is connected to a gate of N-channel transistor 56.

In series with each column line 10, 12, 13, and 14 is a corresponding P-channel transistor 41, 42, 44, and 46 the sources of which connect to Vcc and which are driven by signals NCOLDEC0, NCOLDEC1, NCOLDEC2, and NCOLDEC3. The latter transistors are used to precharge column lines 10, 12, 13, and 14. The latter columns lines are discharged to ground by respective transistors 24, 26, 28 and 30 whose drains are attached to the associated column line and whose sources are coupled to ground. The gates of the latter transistors are each coupled to a DISROM line 31.

At selected intersections of rows W0, W1, W2, and W3 and columns 10, 12, 13, and 14 there are located N-channel transistors 16, 17, 18, and 20 whose gates are connected to the corresponding word line, whose drain connects to the corresponding column or bit line and whose sources connect to ground. These transistors represent programmations of the ROM array.

The circuitry within dotted outline 77 is repeated within blocks 76, 78, and 80. Similarly, the gates of N-channels 58, 60 and 62 are coupled to lines 84, 86 and 88 from blocks 76, 78, and 80, respectively. Each of transistors 56, 58, 60 and 62 have their sources to drain paths connected in series. To the drain of transistor 56 there is connected the drain of a P-channel transistor 54 whose source is connected to $V_{cc}$. To the drain of transistor 62 there is connected the drain of an N-channel transistor 66 whose source is connected to ground. The gates of both transistors 54 and 66 are connected to OE2 line 72. Also connected to the drain of transistor 56 is one input of a NOR gate 68. The other input 70 of NR gate 68 forms NH4 line. The output of gate 68 drives the gate of transistor 74 whose source is connected to ground and whose drain is connected to a precharged node (not shown). Block 90 designates the remainder of the array not included in blocks 77, 76, 78 and 80.

Figure 3:
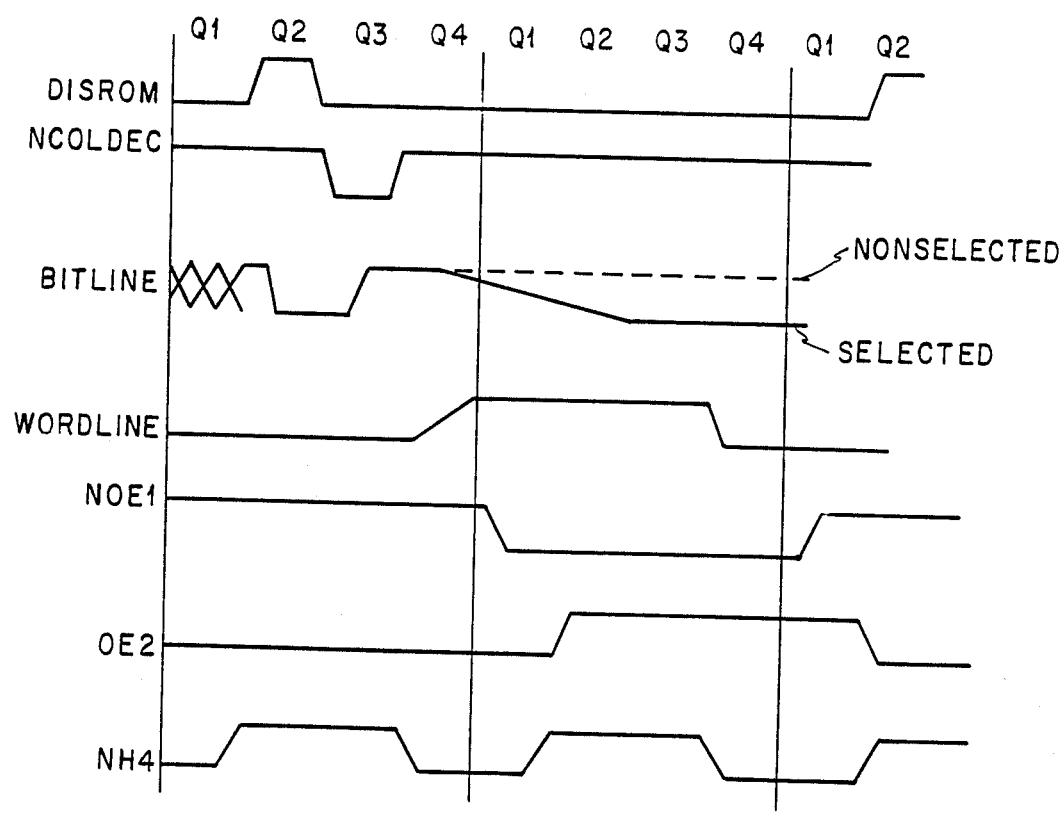
FIG. 3 is a timing diagram for the circuit of FIG. 1.

Referring to the timing diagram of FIG. 3 as well as to FIG. 1 the signal on DISROM line 31 goes high during Q2 turning on transistors 24, 26, 28, and 30 which discharge bit lines 10, 12, 13 and 14. Following the latter discharging, P-channel transistors 34, 36, 37, and 38 all turn on. With the signal on NOE1 line initially high, transistor 40 grounds the sources and drains of transistors 34, 36, 37, and 38. DISROM then goes low at the end of Q2 turning off transistors 24, 26, 28, and 30. A selected one of NCOLDEC0, NCOLDEC1, . . . NCOLDEC15 goes low driving on a corresponding one of transistors 41, 42, 44, and 46 in one of blocks 77, 76, 78 and 80 thereby precharging that bit line to $V_{cc}$. If, for example, that line is column line 13 and a signal on W3 row line turns on transistor 18 then the latter discharges column line 13 to ground from $V_{cc}$. Transistor 37, which was turned off by line 13 being driven to $V_{cc}$ now turns on. When NOE1 drops to ground turning on P-channel transistor 32 and turning off transistor 40 all of the sources and drains of transistors 34, 36, 37, and 38 which were at ground goe to $V_{cc}$. The source of transistor 38 being at $V_{cc}$ drives transistor 56 on.

If none of the column lines in blocks 76, 78, and 80 are high when NOE1 goes low, i.e. none are selected, $V_{cc}$ will be transmitted to the gate of transistors 58, 60, and 62 turning all of the latter on. With transistors 56, 58, 60 and 62 all on, once the signal on OE2 is raised, transistor 66 turns on, transistor 54 turns off and input line 55 of NOR gate 68 is low. Thus, with one input low, when the signal on NH4 line 70 goes low at Q4 of the second machine cycle then the output of NOR gate 68 will go high and turn on transistor 74. If any one of lines 82, 84, 86, and 88 are low then a high signal level is fed along input line 55 which results in a low output and transistor 74 being kept off. Since the drain of transistor 74 is connected to a precharge output node, the latter will result in a high output signal. Thus, for a particular row and column in the array if there is a transistor at that junction, then transistor 74 will be turned on and discharge an output node (not shown) to ground. If there is no transistor at that junction then the latter output node will not be discharged.

The simple arrangement of the present sense amplifier results in a structure that is amenable to a simple layout and is capable of operating at high speeds. Transistors 34, 36, 37, and 38 can be made relatively small or about 2.5 times the size of array transistors 16, 17, 18, and 20. Similarly, transistors 56, 58, 60 and 62 can be made about 2.5 times the size of transistors 34, 36, 37 and 38. This is possible because of the relatively low interconnect capacitance at each node between each bit line and the sense amplifier.

While this invention has been described with reference to an illustrative embodiment, this description is not intended to be construed in a limiting sense. Various modifications of the illustrative embodiments of the invention, will be apparent to persons skilled in the art upon reference to this description. It is, therefore, contemplated that the appended claims will cover any such modifications or embodiments as fall within the true scope of the invention.

What is claimed is:

1. A sense amplifier for a read only memory cell array of a type having a plurality of bit lines and a bit line precharging circuit, comprising:
   a dynamic NOR circuit having high impedance inputs coupled to respective bit lines of a set of said bit lines;
   an inverter circuit having an input coupled to an output of said dynamic NOR circuit; and
   an output buffer circuit having an input coupled to an output of said inverter circuit.

2. A sense amplifier according to claim 1, wherein said dynamic NOR circuit includes a plurality of P-channel transistors having gates coupled to respective ones of said bit lines of said set of bit lines.

3. A sense amplifier according to claim 2, wherein source to drain paths of said P-channel transistors are coupled in series, high voltage NR switch means is coupled to a high voltage end thereof for switching high voltage onto the high voltage end in response to an NOE1 control signal, a NOR ground switch means is coupled to a ground end thereof for switching ground potential onto the ground end in response to an NOE1 control signal, and an output line coupled to the ground end of said series connected P-channel transistors.

4. A sense amplifier for a read only memory cell array of a type having a plurality of bit lines and a bit line precharging circuit, comprising:
   a plurality of dynamic NOR circuits each having high impedance inputs coupled to respective bit lines of a corresponding set of said bit lines;
   a NAND circuit having inputs coupled to respective outputs of each of said dynamic NOR circuits; and
   an output buffer circuit having an input coupled to an output of said NAND circuit.

5. A sense amplifier according to claim 4, wherein each of said dynamic NR circuits include a plurality of P-channel transistors having gates coupled to respective ones of said bit lines.

6. A sense amplifier according to claim 5, wherein source to drain paths of said P-channel transistors are coupled in series, high voltage NOR switch means is coupled to a high voltage end thereof for switching high voltage onto the high voltage end in response to an NOE1 control signal, a NOR ground switch means is coupled to a ground end thereof for switching ground potential onto the ground end in response to an NOE1 control signal, and an output line coupled to the ground end of said series connected P-channel transistors.

7. A sense amplifier according to claim 6, wherein said NOR ground switch means is an N-channel transistor whose source to drain path is coupled between ground and the ground end of said series connected P-channel transistors, and whose gate is couplable to a NE1 signal source.

8. A sense amplifier according to claim 6, wherein said NOR high voltage switch means is a P-channel transistor whose source to drain path is connected between a high voltage source and the high voltage end of said series connected P-channel transistors.

9. A sense amplifier according to claim 4, wherein said NAND circuit includes a plurality of N-channel transistors, a gate of each of which is coupled to an output of a corresponding NOR circuit, and whose source to drain paths are connected in series with a low end coupled to ground through an N-channel transistor switch and a high end coupled to a high voltage through a P-channel transistor switch, the gates of said transistors switches both being coupled to an OE2 signal source.

10. A sense amplifier according to claim 9, including a NOR gate having one input coupled to the high end of said series connected N-channel transistors and another input coupled to an NH4 control signal source for enabling and disabling said NOR gate.

* * * * *